US008027482B2

(12) United States Patent
Braun

(10) Patent No.: US 8,027,482 B2
(45) Date of Patent: Sep. 27, 2011

(54) DVD AUDIO ENCODING USING ENVIRONMENTAL AUDIO TRACKS

(75) Inventor: Jeffrey Braun, Orinda, CA (US)

(73) Assignee: Hollinbeck Mgmt. GmbH, LLC, Wilimington, DE (US)

( * ) Notice: Subject to any disclaimer, the term of this patent is extended or adjusted under 35 U.S.C. 154(b) by 1079 days.

(21) Appl. No.: 10/779,150

(22) Filed: Feb. 12, 2004

(65) Prior Publication Data

US 2004/0252851 A1 Dec. 16, 2004

Related U.S. Application Data

(60) Provisional application No. 60/447,859, filed on Feb. 13, 2003.

(51) Int. Cl.
*H03G 3/00* (2006.01)

(52) U.S. Cl. .......................................... 381/61; 381/119

(58) Field of Classification Search .................... 381/61, 381/63, 102, 10, 119; 700/94
See application file for complete search history.

(56) References Cited

U.S. PATENT DOCUMENTS

| | | | | |
|---|---|---|---|---|
| 4,975,771 | A | | 12/1990 | Kassatly |
| 5,404,295 | A | | 4/1995 | Katz et al. |
| 5,450,490 | A | * | 9/1995 | Jensen et al. .................. 380/253 |
| 5,689,496 | A | * | 11/1997 | Amano ...................... 369/275.4 |
| 5,734,862 | A | | 3/1998 | Kulas |
| 5,850,545 | A | | 12/1998 | Matsushita |
| 5,895,124 | A | | 4/1999 | Tsuga et al. |
| 5,913,010 | A | | 6/1999 | Kaneshige et al. |
| 5,923,627 | A | | 7/1999 | Miwa et al. |
| 5,929,857 | A | | 7/1999 | Dinalto et al. |
| 5,963,256 | A | | 10/1999 | Tahara |

(Continued)

FOREIGN PATENT DOCUMENTS

JP 07210174 * 8/1995

OTHER PUBLICATIONS

Bargeron, et al. "Annotations for Streaming Video on the Web", CHI '99 Extended Abstracts on Human Factors in Computing Systems, ACM Press, published 1999, pp. 278-279.

*Primary Examiner* — Vivian Chin
*Assistant Examiner* — Con P Tran
(74) *Attorney, Agent, or Firm* — Knobbe, Martens, Olson & Bear LLP

(57) ABSTRACT

Audio tracks including environmental information are recorded on a DVD, or other playback medium using microphones, vibration sensors, or other devices that capture ambient sound from the original environment in which a performance, presentation or other sound is created. For example, environmental audio tracks can be obtained by placing microphones on the floor, ceiling and walls of an amphitheater during a pop music performance. Any object, item or surface can be a candidate from, or within, which to capture an ambient sound. Sounds can be obtained from sensors mounted to musicians, audience members, theater seats, various rooms within a building, etc. The environmental audio tracks (EATs) can be provided individually or mixed together with one or more other EATs, one or more standard recorded tracks, or otherwise mixed or combined with other sounds. Or the EATs can be processed, effected, etc., as desired. The original or modified EATs are then encoded onto a DVD (or other medium) so that a listener can selectively hear the EATs alone, or in combination with, other audio tracks on the DVD.

39 Claims, 2 Drawing Sheets

U.S. PATENT DOCUMENTS

| | | | | |
|---|---|---|---|---|
| 5,999,698 | A | 12/1999 | Nakai et al. | |
| 6,006,241 | A | 12/1999 | Purnaveja et al. | |
| 6,085,185 | A | 7/2000 | Matsuzawa et al. | |
| 6,088,506 | A | 7/2000 | Yoshio et al. | |
| 6,105,063 | A | 8/2000 | Hayes, Jr. | |
| 6,173,287 | B1 | 1/2001 | Eberman et al. | |
| 6,173,317 | B1 | 1/2001 | Chaddha et al. | |
| 6,245,982 | B1 | 6/2001 | Suzuki et al. | |
| 6,246,401 | B1 | 6/2001 | Setogawa et al. | |
| 6,256,453 | B1 | 7/2001 | Takano | |
| 6,263,346 | B1 | 7/2001 | Rodriquez | |
| 6,289,165 | B1 | 9/2001 | Abecassis | |
| 6,307,550 | B1 | 10/2001 | Chen et al. | |
| 6,332,144 | B1 | 12/2001 | deVries et al. | |
| 6,404,925 | B1 | 6/2002 | Foote et al. | |
| 6,430,361 | B2 | 8/2002 | Lee | |
| 6,430,609 | B1 | 8/2002 | Dewhurst et al. | |
| 6,434,097 | B1 | 8/2002 | Lewis et al. | |
| 6,449,653 | B2 | 9/2002 | Klemets et al. | |
| 6,467,080 | B1 | 10/2002 | Devine et al. | |
| 6,477,315 | B1 | 11/2002 | Ohomori | |
| 6,501,770 | B2 | 12/2002 | Arsenault et al. | |
| 6,546,405 | B2 | 4/2003 | Gupta et al. | |
| 6,687,211 | B2 * | 2/2004 | Sawabe et al. | 369/275.3 |
| 6,731,185 | B2 | 5/2004 | Taniguchi | |
| 6,789,109 | B2 | 9/2004 | Samra et al. | |
| 6,806,885 | B1 | 10/2004 | Piper et al. | |
| 6,898,799 | B1 | 5/2005 | Jarman | |
| 6,954,419 | B1 | 10/2005 | Kimura et al. | |
| 6,954,581 | B2 | 10/2005 | Miller et al. | |
| 6,965,723 | B1 | 11/2005 | Abe et al. | |
| 6,985,188 | B1 | 1/2006 | Hurst, Jr. | |
| 7,151,214 | B2 * | 12/2006 | Barry | 84/600 |
| 7,161,079 | B2 | 1/2007 | Nishitani et al. | |
| 7,334,026 | B2 | 2/2008 | Samra et al. | |
| 2001/0033736 | A1 | 10/2001 | Yap et al. | |
| 2002/0032768 | A1 | 3/2002 | Voskuil | |
| 2002/0051119 | A1 * | 5/2002 | Sherman et al. | 352/1 |
| 2002/0092021 | A1 | 7/2002 | Yap et al. | |
| 2003/0028273 | A1 * | 2/2003 | Lydecker et al. | 700/94 |
| 2003/0191776 | A1 | 10/2003 | Obrador | |
| 2003/0236581 | A1 * | 12/2003 | Chambers et al. | 700/94 |
| 2004/0073930 | A1 | 4/2004 | Demas et al. | |
| 2004/0078215 | A1 | 4/2004 | Dahlin et al. | |
| 2004/0107439 | A1 | 6/2004 | Hassell et al. | |
| 2004/0181592 | A1 | 9/2004 | Samra et al. | |
| 2004/0201544 | A1 | 10/2004 | Love et al. | |
| 2005/0234958 | A1 | 10/2005 | Sipusic et al. | |
| 2005/0262542 | A1 | 11/2005 | DeWeese et al. | |

* cited by examiner

DVD AUDIO ENCODING USING ENVIRONMENTAL AUDIO TRACKS

CLAIM OF PRIORITY

This application claims priority from U.S. Provisional Patent Application Ser. No. 60/447,859 filed Feb. 13, 2003 entitled "DVD Audio Encoding Using Environment Audio Tracks".

BACKGROUND OF THE INVENTION

This invention relates in general to playback of a production and more specifically to playback of a production from a Digital Versatile Disc (DVD) including selectable, encoded environmental audio tracks.

Enjoyment of digital content is growing in popularity. Video and movies can be viewed from platforms such as computer systems, consumer digital devices such as video compact disc (CD), DVD players, and other displays, systems or platforms. Other formats, such as those promulgated by the Motion Picture Expert Group (MPEG) allow stored or streamed visual productions over digital networks.

Audio is an important aspect of these productions. The large bandwidth and capacity of, e.g., a DVD makes it possible for multiple high fidelity audio tracks to be used in productions. Audio applications include stereo, surround sound, three-dimensional audio, and others. Naturally, it is desirable to improve on the audio portion of a production by providing a consumer, or audience, with additional audio quality, experiences, choices or other features.

BRIEF SUMMARY OF THE INVENTION

The present invention includes "environmental audio tracks" on a DVD, or other playback medium. Environmental audio tracks are recorded using microphones, vibration sensors, or other devices that capture ambient sound from the original environment in which a performance, presentation or other sound is created. For example, environmental audio tracks can be obtained by placing microphones on the floor, ceiling and walls of an amphitheater during a pop music performance. Any object, item or surface can be a candidate from, or within, which to capture an ambient sound. Sounds can be obtained from sensors mounted to musicians, audience members, theater seats, various rooms within a building, etc.

The environmental audio tracks (EATs) can be provided individually or mixed together with one or more other EATs, one or more standard recorded tracks, or otherwise mixed or combined with other sounds. Or the EATs can be processed, effected, etc., as desired. The original or modified EATs are then encoded onto a DVD (or other medium) so that a listener can selectively hear the EATs alone, or in combination with, other audio tracks on the DVD.

By using this approach, a user, or viewer/listener, of the DVD presentation can obtain an enhanced experience that can be more realistic, artistic, amusing or entertaining than a non-enhanced playback. For example, a user can choose to deviate from a rather sterile studio recording approach of a live and/or recorded music performance and can add in reverberation, or noise, characteristics of the room in which the performance occurred. More or less crowd noise can be added into the playback. The performance can be simulated from different rooms in a building or even from places outside of the building, such as outside of a large arena. Depending on the track and processing, frequency responses at different points from the stage speakers can be selected for a more raw, live sound. Many variations are possible.

In one embodiment the invention provides a method for providing audio content on a medium, the method comprising recording a physical effect at a point in a structure during a live performance, wherein the physical effect is a response to an acoustic vibration caused by the live performance; including the recorded physical effect in the medium; and including a direct recording of the live performance as a separate track in the medium.

In another embodiment the invention provides a medium including digital information, the medium comprising one or more standard audio tracks; and environmental modeling information of a room in which one or more of the standard audio tracks were recorded.

In another embodiment the invention provides a method for creating a readable digital medium, the method comprising including one or more standard audio tracks in the readable digital medium; and including environmental modeling information of a room in which one or more of the standard audio tracks were recorded onto the readable digital medium.

In another embodiment the invention provides a playback system for playing audio information included on a readable medium, the playback system comprising a processor for modifying the audio information in the standard audio tracks according to at least a portion of the environmental modeling information.

In another embodiment the invention provides a method for providing acoustic environment modeling information, the method comprising obtaining environmental information about a room's acoustic characteristics; including the obtained environmental information in a recordable medium; including one or more standard audio tracks recorded during a live performance in the room on the recordable medium; and using the obtained environmental information during playback of the standard audio tracks to alter an audio presentation of the standard audio tracks to a human listener.

DETAILED DESCRIPTION OF THE INVENTION

Figure 1:
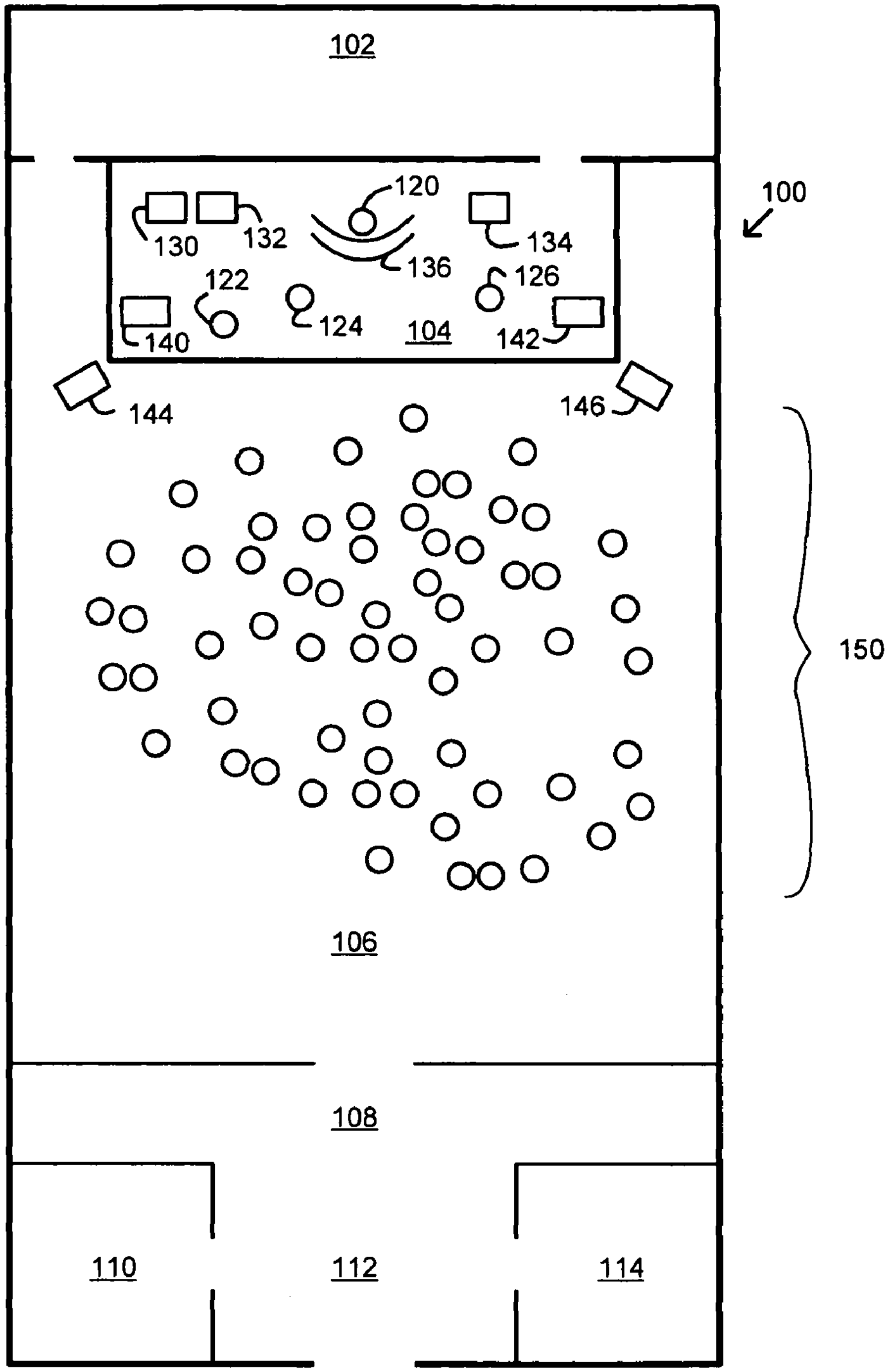
FIG. 1 illustrates a live music venue and the process of obtaining environmental audio tracks.

FIG. 1 illustrates an approach for obtaining environmental audio tracks (EATs). In FIG. 1, building 100 is an indoor venue for live music. For example, such a venue can be an auditorium, nightclub, arena, etc. In general, any building, structure, or merely area or location can be appropriate for the approach of the present invention. Although a preferred embodiment of the invention is directed to recording and playback of a live music event, any type of event or events that produce audio are susceptible for use with the present invention.

In FIG. 1, building 100 is shown in an overhead view. Building 100 includes several structural areas such as backstage area 102, stage 104, auditorium 106, hallway 108, entryway 112 and auxiliary rooms 110 and 114. Musicians 120, 122, 124 and 126 are shown on stage 104 along with various equipment such as amplifiers 130, 132 and 134, public address (PA) speakers 140 and 142 and drumset 136. Naturally, any manner of equipment, number and type of musicians, props, instruments or other people or objects can exist on stage 104 or elsewhere inside, or outside of building 100. It should also be apparent that any size, shape and configuration of building areas and interior items can be used.

Auditorium 106 includes audience members at 150, indicated by circles. PA speakers 144 and 146 are positioned on the auditorium floor. A typical venue can include numerous PA speakers positioned in and around the auditorium of many shapes and sizes, hanging from the ceiling or sides of walls, facing different directions, etc. Auditorium 106 also typically includes many structural members, fixtures, furniture, ornamentation, and other items that are not shown in FIG. 1.

A preferred embodiment of the invention uses sound sensors, such as microphones, to capture environmental sounds at different points of the structure. Sounds can be captured in proximity to, on, or within different items and structures, and at different locations within (or outside of) the venue. A preferred embodiment of the invention uses microphones at different points of the auditorium to capture different frequency emissions from a sound source located on the stage. The captured sounds, or environmental audio tracks, are later analyzed to build a mathematical model of the room acoustics. The microphones and sound source equipment can be removed prior to a live musical performance so that there is no intrusion into the normal recording (video and audio) of the performance.

The EATs can later be used during playback to enhance a users enjoyment of a production. For example, sounds can be recorded at different rows of seats, and at different points within a row, within a fixed-seating theater. These tracks can later be used to allow a user to play back a DVD presentation and select from which seat in the theater they choose to listen. Only a few seat locations need to be recorded as audio pre, or post, processing can be performed to do interpolations, or extrapolations, to other seats.

Another approach is to record audio at different points of the auditorium or building during a live performance. In this case it may be desirable to provide the audio tracks without any processing. Alternatively, typical types of audio processing such as equalization (EQ), normalization, echo, reverb, etc., can be applied prior to recording the tracks onto a fixed medium (i.e., "pre-processing"), or during playback of recorded tracks from the medium (i.e., "post-processing"). Pre-processing allows a sound engineer to design the audio presentation, while post-processing, and other controls upon playback, can allow a user to have choose characteristics of the audio presentation.

Other types of sensors, rather than audible sound sensors, can be used. Vibration sensors can be used to capture low, and even subsonic, effects. These can be processed, or translated, to audible effects or tactile effects, depending on the output playback device. Walls, can be applied with sensors to pick up vibrations, PA cabinets, amplifiers, instruments, audience members, rooms and other items or structures can be recorded to obtain sound signals generated in, through, or adjacent to the items. Microphones can be placed in proximity to the audience to record reactions, placed close to musicians to hear sounds that are otherwise lost in the louder amplified sounds of the auditorium. Surface mounted microphones can be placed on the floor to hear foot stomping, etc.

Figure 2:
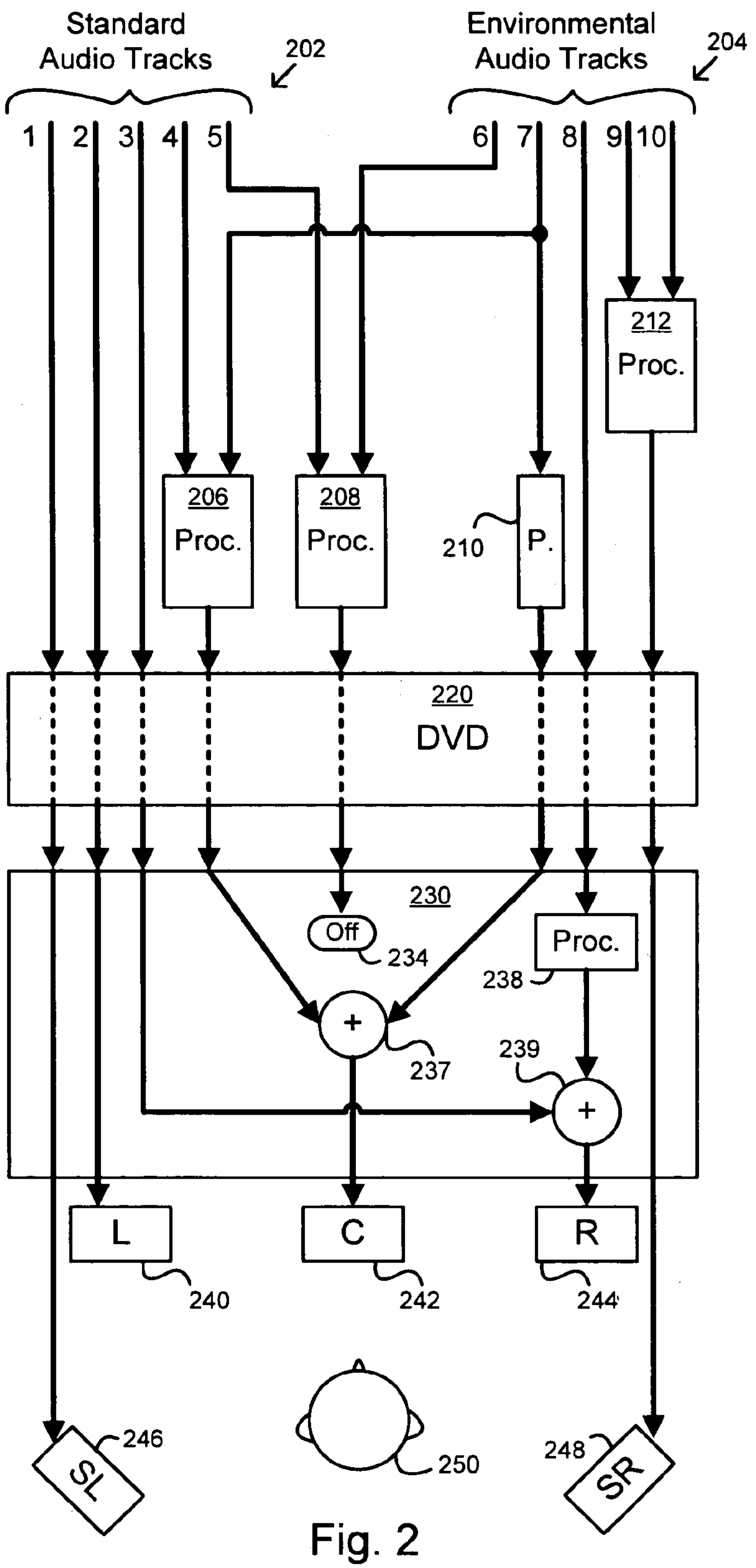
FIG. 2 is a diagram showing encoding of environmental audio tracks, along with standard audio tracks, onto a DVD and selective playback of the audio tracks with mixing and processing.

FIG. 2 shows encoding and playback of environmental audio tracks along with standard audio tracks.

In FIG. 2, five standard audio tracks 202 are encoded onto a DVD along with five EATs 204. Combinations of these tracks are also used to create derived tacks, and combined tracks, so that ultimately 8 separate tracks are encoded onto DVD 220. For example, track 5 is combined with track 6 and optionally applied with effects via processor 208 to provide a single track that is encoded onto DVD 220. Track 7 is split so that it is combined with track 4 and processed in processor 206. Track 7 is also sent, individually, to processor 210. Note that any arbitrary combining, processing or other manipulation of tracks is possible at the pre-processing stage—as is known in the art.

DVD 220 is then prepared with the encoded audio. A preferred embodiment includes the audio along with video or movie content of a live musical performance. However, it is also possible to have an audio-only presentation. The medium can be any suitable format for delivery of audio information such as an audio CD, CDROM, mini-disc, solid-state memory, hard disk drive, cassette tape, etc. A preferred embodiment of the invention is designed to use a format in accordance with the "DVD Specifications for Read-Only Disc," Version 1.1, published by DVD Format/Logo Licensing Corporation. However, any suitable format can be used.

Playback device 230 is used to selectively play back audio tracks from DVD 220. Selective playback can be under user control, preprogrammed, controlled remotely by a third party, etc. User 250 is positioned in surround sound speakers 240, 242, 244, 246 and 248. Note that any type of audio presentation hardware can be used, including stereo, subwoofer, headphones, movie theater sound systems, custom systems, etc. Playback device 230 includes features for assigning tracks to arbitrary speakers and for mixing tracks, such as shown at mixing points 237 and 239. Any combination of tracks can be mixed together. Playback device 230 can also be used to mix tracks at mixing points such as 237 and 239. Or to provide other types of processing via processors such as 238. Note that processing, in general, can be digital, analog, or by any means as is known in the art. Tracks can be selectively routed to different speakers, mixing points, processors, etc. Tracks can be selectively used, or not. For example, FIG. 2 shows a track at 234 being terminated and not presented in any form to an output device such as one of the speakers.

One aspect of the invention uses room characteristics data for a room in which a listener is playing back a recording (i.e., the "playback room"). Data about the playback room characteristics can be obtained in a manner similar to that described above for the live performance theater. Or the playback room characteristic data can be obtained in other ways, such as by using default, or estimated, characteristics, using a math model of the room's size, shape, materials, etc. The playback room's characteristics can be used to process the standard audio tracks and/or the EATs to more accurately create the original theater's acoustics, or for other purposes.

One way to manipulate multiple audio tracks from a DVD is to use a "karaoke mode" format and functions specified in the standard format described by the publications of the DVD Format/Logo Licensing Corporation, referenced above. The karaoke mode allows for multiple channels of audio in different encoding formats that can be selected and assigned to different channels during playback. The audio selection functions provided by a playback device that follows the standard format can be used to achieve some of the functions of playback device 230, described above. Currently, karaoke mode supports 5 channels in a single "stream." Other available modes in the standard format include up to 8 channels per each of 8 streams.

Although the invention has been described with reference to specific embodiments thereof, these embodiments are merely illustrative, and not restrictive, of the invention. For example, although embodiments of the invention has been discussed primarily with respect to a DVD medium, any other type of media or source of audio tracks can be used to equal advantage. A storage medium can include magnetic, optical, memory, etc. Embodiments of the invention can be used with a streaming audio source such as from a satellite, cable television network, telephone modem, or Internet or other digital network system or communication channel. Any digital transmission system, format, encoding, encryption or compression approaches can be used with the present invention.

The invention can be used with live and/or recorded music, or any other type of audio or sound signals. Any suitable programming language can be used to implement the routines of the present invention including C, C++, Java, assembly language, etc. Different programming techniques can be employed such as procedural or object oriented. The routines can execute on a single processing device or multiple processors. Although the steps, operations or computations may be presented in a specific order, this order may be changed in different embodiments. In some embodiments, multiple steps shown as sequential in this specification can be performed at the same time. The sequence of operations described herein can be interrupted, suspended, or otherwise controlled by another process, such as an operating system, kernel, etc. The routines can operate in an operating system environment or as stand-alone routines occupying all, or a substantial part, of the system processing.

In the description herein, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

A "computer-readable medium" or "machine-readable medium" for purposes of embodiments of the present invention may be any medium that can contain, store, communicate, propagate, or transport the program for use by or in connection with the instruction execution system, apparatus, system or device. The computer readable medium can be, by way of example only but not by limitation, an electronic, magnetic, optical, electromagnetic, infrared, or semiconductor system, apparatus, system, device, propagation medium, or computer memory.

A "processor" or "process" includes any human, hardware and/or software system, mechanism or component that processes data, signals or other information. A processor can include a system with a general-purpose central processing unit, multiple processing units, dedicated circuitry for achieving functionality, or other systems. Processing need not be limited to a geographic location, or have temporal limitations. For example, a processor can perform its functions in "real time," "offline," in a "batch mode," etc. Portions of processing can be performed at different times and at different locations, by different (or the same) processing systems. Although specific media (e.g., DVD, CD, CDROM) may be discussed, any type of machine-readable media can be used.

Reference throughout this specification to "one embodiment", "an embodiment", or "a specific embodiment" means that a particular feature, structure, or characteristic described in connection with the embodiment is included in at least one embodiment of the present invention and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

Embodiments of the invention may be implemented by using a programmed general purpose digital computer, by using application specific integrated circuits, programmable logic devices, field programmable gate arrays, optical, chemical, biological, quantum or nanoengineered systems, components and mechanisms may be used. In general, the functions of the present invention can be achieved by any means as is known in the art. Distributed, or networked systems, components and circuits can be used. Communication, or transfer, of data may be wired, wireless, or by any other means.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope of the present invention to implement a program or code that can be stored in a machine-readable medium to permit a computer to perform any of the methods described above.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear. As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims.

Thus, the scope of the invention is to be determined solely by the appended claims.

What is claimed is:

1. A method for providing an audio presentation, the method comprising:

obtaining standard audio track information of a performance;

obtaining environmental information from recordings made during the performance from a plurality of physical locations in the venue;

including the standard audio track information of the performance on a recordable medium as a first set of tracks;

including the obtained environmental information from the recordings made during the performance on the recordable medium as a second set of tracks; and enabling a user to select, using a playback device including a mixer configured to selectively mix the standard audio track information included in the first set of tracks with the environmental information included in the second set of tracks, whether or not to play the second set of tracks at substantially the same time as the first set of tracks during playback of the standard audio track information included in the first set of tracks to thereby alter, using the environmental information included in the second set of tracks, an audio presentation of the standard audio track information.

2. The method of claim 1, wherein environmental information recorded at a different time then the standard audio track information of the performance is included in the second set of tracks.

3. The method of claim 1, the method further comprising enabling the user to play the second set of tracks separately from the first set of tracks.

4. The method of claim 1, the method further comprising creating a mathematic model of acoustics associated with the venue and including mathematical modeling information in the second set of tracks.

5. The method of claim 1, the method further comprising:

using received playback room characteristics to process the standard audio tracks; and/or using received playback room characteristics to process the environmental information.

6. The method of claim 1, wherein the recordings from a plurality of physical locations in the venue include recordings from one or more microphones positioned on a floor, ceiling, or wall.

7. The method of claim 1, wherein the recordings from a plurality of physical locations in the venue include recordings from one or more microphones positioned on one or more corresponding audience members.

8. The method of claim 1, wherein the recordings from a plurality of physical locations in the venue include recordings from one or more vibration sensors.

9. The method of claim 1, wherein the recordings from a plurality of physical locations in the venue include recordings of crowd noise, and where the user can play back the standard audio tracks without the crowd noise.

10. The method of claim 1, wherein the recordings from a plurality of physical locations in the venue include recordings made using at least one microphone that is not present when the performance is recorded.

11. The method of claim 1, wherein the recordable medium is a DVD, and the DVD does not include a video of the performance.

12. The method of claim 1, wherein the audio track information of the performance is streamed over a communication network.

13. The method of claim 1, wherein the audio presentation of the standard audio information is altered during playback by mixing environmental information included in the second set of tracks with the standard audio information in the first set of tracks.

14. A tangible, non-transitory computer-readable medium having computer-executable instructions stored thereon that, if executed by a computing device, cause the computing device to perform a method comprising:

obtaining standard audio track information of a performance;

obtaining environmental information from recordings made during the performance from a plurality of physical locations in the venue;

including the standard audio track information on a recordable medium as a first set of tracks;

including the obtained environmental information on the recordable medium as a second set of tracks; and enabling a user to select, using a playback device including a mixer configured to selectively mix the standard audio track information included in the first set of tracks with the environmental information included in the second set of tracks, whether or not to play the second set of tracks at substantially the same time as the first set of tracks during playback of the standard audio track information included in the first set of tracks to thereby alter, using the environmental information included in the second set of tracks, an audio presentation of the standard audio track information.

15. The tangible computer-readable medium of claim 14, wherein environmental information recorded at a different time then the standard audio track information of the performance is included in the second set of tracks.

16. The tangible computer-readable medium of claim 14, the method further comprising enabling the user to play the second set of tracks separately from the first set of tracks.

17. The tangible computer-readable medium of claim 14, the method further comprising creating a mathematic model of acoustics associated with the venue and including mathematical modeling information in the second set of tracks.

18. The tangible computer-readable medium of claim 14, the method further comprising:

using received playback room characteristics to process the standard audio tracks; and/or using received playback room characteristics to process the environmental information.

19. The tangible computer-readable medium of claim 14, wherein the recordings from a plurality of physical locations in the venue include recordings from one or more microphones positioned on a floor, ceiling, or wall.

20. The tangible computer-readable medium of claim 14, wherein the recordings from a plurality of physical locations in the venue include recordings from one or more microphones positioned on one or more corresponding audience members.

21. The tangible computer-readable medium of claim 14, wherein the recordings from a plurality of physical locations in the venue include recordings from one or more vibration sensors.

22. The tangible computer-readable medium of claim 14, wherein the recordings from a plurality of physical locations in the venue include recordings of crowd noise, and where the user can play back the standard audio tracks without the crowd noise.

23. The tangible computer-readable medium of claim 14, wherein the recordings from a plurality of physical locations in the venue include recordings made using at least one microphone that is not present when the performance is recorded.

24. The tangible computer-readable medium of claim 14, wherein the recordable medium is a DVD, and the DVD does not include a video of the performance.

25. The tangible computer-readable medium of claim 14, wherein the audio track information of the performance is streamed over a communication network.

26. The tangible computer-readable medium of claim 14, wherein the audio presentation of the standard audio information is altered during playback by mixing environmental information included in the second set of tracks with the standard audio information in the first set of tracks in response to the user's selection.

27. An apparatus for providing an audio presentation, the apparatus comprising:

a processor;

a first set of inputs configured to receive standard audio information;

a second set of inputs configured to receive environmental information;

tangible computer-readable medium having computer-executable instructions stored thereon that, if executed by processor, cause the processor to:

obtain standard audio information of a performance via the first set of inputs;

obtain environmental information via the second set of inputs from recordings from a plurality of physical locations in the venue made during the performance;

include the standard audio information on a recordable medium as a first set of tracks;

include the obtained environmental information on the recordable medium as a second set of tracks; and enable a user to select, using a playback device including a mixer configured to selectively mix the standard audio track information included in the first set of tracks with the environmental information included in the second set of tracks, whether or not to play the second set of tracks at substantially the same time as the first set of tracks during playback of the standard audio track information included in the first set of tracks to thereby alter, using the environmental information included in the second set of tracks, an audio presentation of the standard audio track information.

28. The apparatus of claim 27, wherein environmental information recorded at a different time then the standard audio track information of the performance is included in the second set of tracks.

29. The apparatus of claim 27, the method further comprising enabling the user to play the second set of tracks separately from the first set of tracks.

30. The apparatus of claim 27, the method further comprising creating a mathematic model of acoustics associated with the venue.

31. The apparatus of claim 27, the method further comprising:

using received playback room characteristics to process the standard audio information; and/or using received playback room characteristics to process the environmental information.

32. The apparatus of claim 27, wherein the recordings from a plurality of physical locations in the venue include recordings from one or more microphones positioned on a floor, ceiling, or wall.

33. The apparatus of claim 27, wherein the recordings from a plurality of physical locations in the venue include recordings from one or more microphones positioned on one or more corresponding audience members.

34. The apparatus of claim 27, wherein the recordings from a plurality of physical locations in the venue include recordings from one or more vibration sensors.

35. The apparatus of claim 27, wherein the recordings from a plurality of physical locations in the venue include recordings of crowd noise, and where the user can play back the standard audio information without the crowd noise.

36. The apparatus of claim 27, wherein the recordings from a plurality of physical locations in the venue include recordings made using at least one microphone that is not present when the performance is recorded.

37. The apparatus of claim 27, wherein the recordable medium is a DVD, and the DVD does not include a video of the performance.

38. The apparatus of claim 27, wherein the audio information of the performance is streamed over a communication network.

39. The apparatus of claim 27, wherein the audio presentation of the standard audio information is altered during playback by mixing environmental information included in the second set of tracks with the standard audio information in the first set of tracks.

* * * * *